United States Patent [19]
Casper et al.

[11] Patent Number: 6,118,728
[45] Date of Patent: Sep. 12, 2000

[54] CIRCUIT AND METHOD FOR MEMORY DEVICE WITH DEFECT CURRENT ISOLATION

[75] Inventors: Stephen L. Casper; David Pinney; Brent Keeth, all of Boise, Id.

[73] Assignee: Micron Technology, Inc., Boise, Id.

[21] Appl. No.: 09/237,362

[22] Filed: Jan. 26, 1999

Related U.S. Application Data

[62] Division of application No. 08/911,667, Aug. 14, 1997, Pat. No. 5,896,334.
[51] Int. Cl.[7] ........................................... G11C 8/00
[52] U.S. Cl. ................. 365/230.06; 365/200; 365/202
[58] Field of Search ........................... 365/202, 203, 365/200, 190, 230.06

[56] References Cited

U.S. PATENT DOCUMENTS

| | | | |
|---|---|---|---|
| 5,673,219 | 9/1997 | Hashimoto | 365/149 |
| 5,896,334 | 4/1999 | Casper et al. | 365/202 |
| 6,002,622 | 12/1999 | Dean | 365/201 |

*Primary Examiner*—Son Mai
*Attorney, Agent, or Firm*—Schwegman, Lundberg, Woessner & Kluth, P.A.

[57] ABSTRACT

A memory device. The memory device includes an array of word lines and complementary bit line pairs. A number of memory cells are each addressably coupled to intersections of the word line with a bit line of a complementary bit line pair. The memory device also includes addressing circuitry that is coupled to the array so as to select a memory cell. Further, a number of sense amplifiers are provided. Each sense amplifier is coupled to a complementary pair of bit lines. Each complementary pair of bit lines is also coupled to an equilibration circuit. A transistor controllably couples the reference voltage source to the equilibration circuit. The transistor is disabled when one of the bit lines of the complementary pair is defective so as to isolate the reference voltage source and prevent leakage current.

14 Claims, 5 Drawing Sheets

CIRCUIT AND METHOD FOR MEMORY DEVICE WITH DEFECT CURRENT ISOLATION

This application is a divisional of U.S. Ser. No. 08/911,667, filed Aug. 14, 1997, U.S. Pat. No. 5,896,334.

TECHNICAL FIELD OF THE INVENTION

The present invention relates generally to the field of memory devices and, in particular, to a circuit and method for a memory device with defect current isolation.

BACKGROUND OF THE INVENTION

Electronic systems typically store data during operation in a memory device. In recent years, the dynamic random access memory (DRAM) has become a popular data storage device for such systems. Basically, a DRAM is an integrated circuit that stores data as binary, e.g., high and low, logic levels in a large number of cells. The data is stored in a cell as a charge on a capacitor located within the cell. Typically, a high logic level is approximately equal to the power supply voltage and a low logic level is approximately equal to ground.

The cells of a conventional DRAM are arranged in an array so that individual cells can be addressed and accessed. The array can be thought of as rows and columns of cells. Each row includes a word line that interconnects a gate of an access transistor of each cell on the row with a common control signal. Similarly, each column includes a bit line that is coupled to at most a source/drain region of one access transistor of a cell in each row. The capacitor is coupled between a second source/drain region of the access transistor and a common cell plate. Thus, the word and bit lines can be controlled so as to individually access each cell of the array.

To read data out of a cell, the capacitor of a cell is accessed by selecting the word line associated with the cell. An equilibration circuit equilibrates a complementary bit line pair that includes the bit line for the selected cell. The equilibration circuit effectively shorts the bit line pair to a reference supply. The voltage of the reference supply is typically midway between the high and low logic levels. Thus, conventionally, the bit lines are equilibrated to one-half of the power supply voltage, $V_{CC}/2$. When the word line is activated for the selected cell, the capacitor of the selected cell discharges the stored voltage through the access transistor onto the bit line, thus changing the voltage on the bit line. When a high logic value is stored in the selected cell, the voltage on the bit line increases. Conversely, when a low logic level is stored in the selected cell, the voltage on the bit line decreases.

A sense amplifier detects and amplifies the difference in voltage on the bit line compared to the unchanged complementary bit line. The sense amplifier typically includes two main components: an n-sense amplifier and a p-sense amplifier. The n-sense amplifier includes a cross-coupled pair of n-channel transistors that drive the low bit line to ground. The p-sense amplifier includes a cross-coupled pair of p-channel transistors and is used to drive the high bit line to the power supply voltage.

An input/output device for the array, typically an n-channel transistor, is controlled to pass the voltage on the bit line for the selected cell to an input/output line for communication to, for example, a processor of a computer or other electronic system associated with the DRAM. In a write operation, data is passed from the input/output lines to the bit lines by the input/output device of the array for storage on the capacitor in the selected cell.

Conventionally, memory devices are fabricated as integrated circuits on a substrate, semiconductor wafer, or chip. Memory devices produced by conventional techniques may include one or more defects introduced during the production of the memory device. Such defects include, for example, shorted or open word lines, word line to digit line shorts, or defective access transistors and storage capacitors. To overcome these defects, manufacturers produce memory devices with redundant word and bit lines so that the defective parts can be logically, not physically, replaced. One problem with a short between a digit line and a word line is that the equilibration circuit provides a current path for the reference voltage source. The word line to bit line short effectively places the bit line at ground potential. When the equilibration circuit is turned on, a transistor in the equilibration circuit provides a path for current to ground from the reference voltage source.

Commonly assigned U.S. Pat. No. 5,235,550 issued to Paul S. Zagar (the "Zagar Patent"), which patent is incorporated herein by reference. The Zagar Patent provides one solution to this problem. The Zagar Patent describes the use of a current-limiting device, such as lightly doped polysilicon, or a long L transistor that is in an always-on state. This device is coupled between a reference voltage source and a number of equilibration circuits (see, e.g., FIG. 4 of the Zagar Patent) to limit the current provided from the reference voltage source to the equilibration circuit. This effectively reduces the current loss due to a word line to bit line short. Unfortunately, this current-limiting device also establishes a time constant which increases the time necessary to restore a digit line to an equilibration voltage level.

For the reasons stated above, and for other reasons stated below which will become apparent to those skilled in the art upon reading and understanding the present specification, there is a need in the art for a memory device with reduced susceptibility to current leakage from an equilibration voltage supply caused by a defective bit line.

SUMMARY OF THE INVENTION

The above-mentioned problems with memory devices and other problems are addressed by the present invention and which will be understood by reading and studying the following specification. A memory device and method are described which use a modified column select signal to turn off a gating transistor that couples an equilibration voltage supply to an equilibration circuit for a repaired out element of the memory device.

In particular, an illustrative embodiment of the present invention includes a memory device. The memory device includes an array of word lines and complementary bit line pairs. The memory device also includes a number of memory cells that are each addressably coupled at intersections of a word line with a bit line of a complementary bit line pair. The memory device further includes addressing circuitry that is coupled to the array so as to select a memory cell. A sense amplifier is coupled to each complementary pair of bit lines. Further, each complementary pair of bit lines is coupled to an equilibration circuit. A transistor is provided to controllably couple a reference voltage source to the equilibration circuit. The transistor is disabled when one of the bit lines of the complementary pair is defective. In another embodiment, the transistor comprises a depletion mode transistor. In another embodiment, the memory device includes a circuit that is coupled to the depletion mode transistor to generate a disable signal when a bit line is determined to be defective. In another embodiment, this circuit controls the operation of input/output transistors coupled to the complementary bit line pair. In another embodiment, the circuit generates a negative voltage when a bit line is determined to be defective and generates an output signal that varies between ground and a positive voltage when a bit line is determined to be acceptable. In another embodiment, a resistive device is coupled between the reference voltage source and the transistor so as to limit the current from the reference voltage source. In another embodiment, the resistive device comprises a long L transistor with a gate that is biased at a high voltage so as to turn on the long L transistor.

In another embodiment, a column select circuit for a memory device is provided. The column select circuit includes a decoder circuit that determines whether a selected column address corresponds to a column that has been repaired out. An inverter is coupled to the decoder circuit with a variable low potential. A pull-down circuit is coupled to the inverter so as to provide the low potential for the inverter. In this embodiment, the pull-down circuit provides a negative voltage when a selected column is disabled and provides ground potential to the inverter when the selected column is operable.

In another embodiment, a method for coupling a reference voltage source to an equilibration circuit for a column of a memory device is provided. The method provides for determining whether a selected column of a memory device is defective. When the column is determined to be defective, a control signal is provided with a first voltage level to a gate of a transistor coupled between the reference voltage source and the equilibration circuit so as to isolate the reference voltage source from the equilibration circuit When the column is not defective, a control signal is provided with a second voltage level to the gate of the transistor. In another embodiment, the method further includes a step of controlling input/output transistors of the memory device that are coupled to the column with the same control signal used to control the transistor that is coupled between the reference voltage source and the equilibration circuit.

In another embodiment, an electronic system is provided. The electronic system includes a microprocessor and a memory device. The memory device is coupled to the microprocessor. The memory device includes a number of memory cells that are coupled to form an array by word lines and bit line pairs. The memory device includes a transistor for each bit line pair that couples a reference voltage supply to an equilibration circuit for the bit line pair. Thus, the reference voltage supply is isolated from the equilibration circuit when one of the bit lines in the pair is determined to be defective so as to prevent leakage current. In another embodiment, the transistor comprises a depletion mode transistor. In another embodiment, the memory device further includes a column select circuit that controls both the transistor and input/output transistors associated with a bit line pair. In another embodiment, the memory device includes a resistive device coupled between the reference voltage source and the transistor to limit the current from the reference voltage source. In another embodiment, the resistive device comprises a long L transistor that is biased with a high voltage applied to the gate of the long L transistor.

DETAILED DESCRIPTION OF THE INVENTION

In the following detailed description, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilize and that logical, mechanical and electrical changes may be made without departing from the spirit and scope of the present invention. The following detailed description is, therefore, not to be taken in a limiting sense.

The illustrative embodiments described herein concern electrical circuitry which uses voltage levels to represent binary logic states—namely, a "high" logic level and a "low" logic level. Further, electronic signals used by the various embodiments of the present invention are generally considered active when they are high. However, an asterisk (*) following the signal name in this application indicates that the signal is negative or inverse logic. Negative or inverse logic is considered active when the signal is low.

Figure 1:
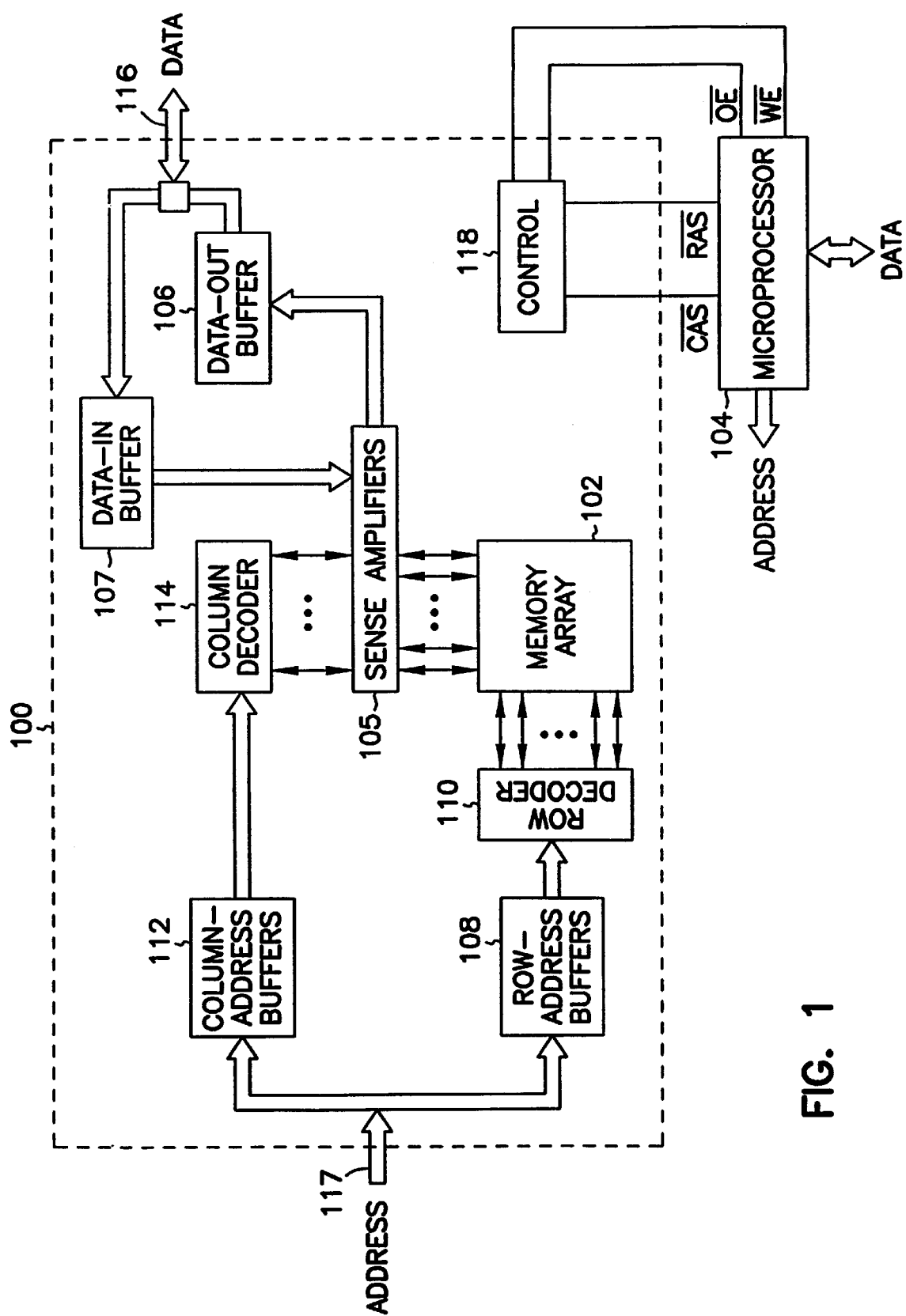
FIG. 1 is a block diagram of an illustrative embodiment of a memory device according to the teachings of the present invention.

FIG. 1 is a block diagram of an illustrative embodiment of the present invention. DRAM 100 includes memory array 102. Memory array 102 includes rows and columns of addressable memory cells. Each memory cell in a row is coupled to a common word line. Additionally, each memory cell in a column is coupled to a common bit line. Each cell in memory array 102 includes a storage capacitor and an access transistor as is conventional in the art.

DRAM 100 interfaces with, for example, microprocessor 104 through address lines 117 and data lines 116. Alternatively, DRAM 100 may interface with a DRAM controller, a microcontroller, a chip set or other electronic system. Microprocessor 104 also provides a number of control signals to DRAM 100, including but not limited to, row and column address strobe signals RAS* and CAS*, write enable signal WE*, an output enable signal OE* and other conventional control signals.

Row address buffer 108 and row decoder 110 receive and decode row addresses from row address signals provided on address lines 117 by microprocessor 104. Each unique row address corresponds to a row of cells in memory array 102. Row decoder 110 includes a word line driver, an address decoder tree, and circuitry which translates a given row address received from row address buffers 108 and selectively activates the appropriate word line of memory array 102 via the word line drivers.

Column address buffer 112 and column decoder 114 receive and decode column address signals provided on address lines 117. Column decoder 114 also determines when a column is defective and the address of a replacement column. Column decoder 114 is coupled to sense amplifiers 105. Sense amplifiers 105 are coupled to complementary pairs of bit lines of memory array 102. Sense amplifiers 105 include equilibration circuits that bias the complementary bit lines at a selected voltage prior to reading data from a cell of memory array 102. Advantageously, the equilibration circuits are controllably coupled to a reference voltage supply such that the reference voltage supply may be decoupled from the equilibration circuit to prevent current leakage due to a defective column.

Sense amplifiers 105 are coupled to data-in buffer 107 and data-out buffer 106. Data-in buffers 107 and data-out buffers 106 are coupled to data lines 116.

During a write operation, data lines 116 provide data to data-in buffer 107. Sense amplifier 105 receives data from data-in buffer 107 and stores the data in memory array 102 as a charge on a capacitor of a cell at an address specified on address lines 117.

During a read operation, DRAM 100 transfers data to microprocessor 104 from memory array 102. Complementary bit lines for the accessed cell are equilibrated during a precharge operation to a reference voltage provided by an equilibration circuit and a reference voltage supply. The charge stored in the accessed cell is then shared with the associated bit lines. A sense amplifier of sense amplifiers 105 detects and amplifies a difference in voltage between the complementary bit lines. The sense amplifier passes the amplified voltage to data-out buffer 106.

Advantageously, the reference voltage supply used to equilibrate the bit line in this embodiment may be selectively decoupled from the equilibration circuit using a gating transistor to prevent leakage current due to a defective bit line. This can be accomplished using, for example, a modified column select signal which turns off a transistor coupled between the equilibration circuit and the reference power supply.

Control logic 118 is used to control the many available functions of DRAM 100. In addition, various control circuits and signals not detailed herein initiate and synchronize DRAM 100 operation as known to those skilled in the art. As stated above, the description of DRAM 100 has been simplified for purposes of illustrating the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention. The DRAM implementation described herein is illustrative only and not intended to be exclusive or limiting.

Figure 2:
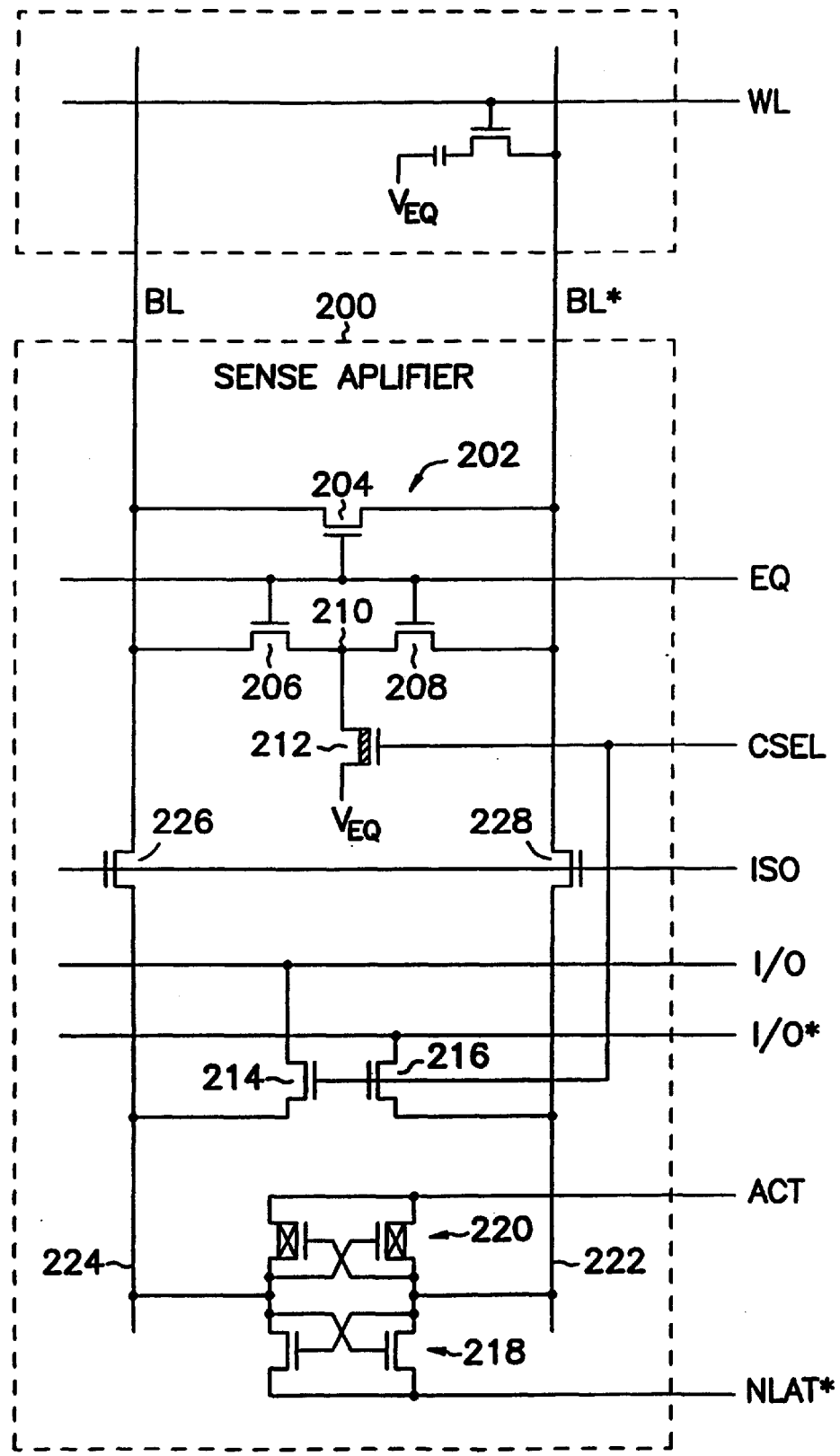
FIG. 2 is a schematic diagram of an embodiment of a sense amplifier according to the teachings of the present invention.

FIG. 2 is a schematic diagram of an embodiment of a sense amplifier according to the teachings of the present invention. Sense amplifier 200 includes equilibration circuit 202. Equilibration circuit 202 includes n-channel transistors 204, 206, and 208. Transistor 204, 206, and 208 each include a gate that is coupled to receive a control signal, EQ. Additionally, transistor 204 includes a first source/drain region coupled to bit line BL and a second source/drain region coupled to bit line complement BL*. Transistor 206 includes a first source/drain region coupled to bit line BL and a second source/drain region coupled to node 210. Similarly, transistor 208 includes a first source/drain region that is coupled to bit line complement BL* and a second source/drain region that is coupled to node 210.

In this embodiment, equilibration circuit 202 further includes a depletion mode transistor 212. Transistor 212 includes a first source/drain region that is coupled to node 210. A second source/drain region of transistor 212 is coupled to equilibration voltage source $V_{EQ}$. A gate of transistor 212 is coupled to receive control signal CSEL. Control signal CSEL is also provided to the gates of input/output transistors 214 and 216. Input/output transistors 214 and 216 are coupled so as to pass data between bit line BL and input/output line I/O and between bit line complement BL* and input/output line complement I/O*, respectively.

Sense amplifier 200 further includes n-sense amplifier 218 and p-sense amplifier 220 that are coupled between nodes 222 and 224. Sense amplifiers 218 and 220 comprise cross-coupled pairs of n-channel and p-channel transistors, respectively. N-sense amplifier 218 is controlled by a control signal labeled NLAT* and p-sense amplifier 220 is controlled by a control signal labeled ACT. Finally, sense amplifier 200 includes isolation transistors 226 and 228. Isolation transistor 226 couples bit line BL to node 224. Similarly, isolation transistor 228 couples bit line complement BL* to node 222. The gates of transistors 226 and 228 are coupled to a common control signal, ISO. It is understood that sense amplifier 200 may include an additional equilibration circuit and isolation transistors on the other side of n-sense amplifier 218 such that sense amplifiers 218 and 220 may be shared by two memory arrays.

Sense amplifier 200 provides the advantage of being able to disconnect equilibration voltage source $V_{EQ}$ from equilibration circuit 202 when bit line BL or bit line complement BL* has been repaired out of a memory array. In operation, equilibration voltage source $V_{EQ}$ is disconnected from equilibration circuit 202 by control signal CSEL. When bit line BL or bit line complement BL* has been repaired out, control signal CSEL will be reduced to a voltage that is preferably below ground potential. For example, the control signal CSEL can be established at the voltage level for the back-bias voltage, $V_{BB}$. In normal operation, control signal CSEL operates to control input/output transistors 214 and 216. Thus, when bit line BL and bit line complement BL* are not defective, control signal CSEL varies between $V_{CC}$, the power supply voltage, and ground as in normal operation of a sense amplifier for a memory device.

Figure 3:
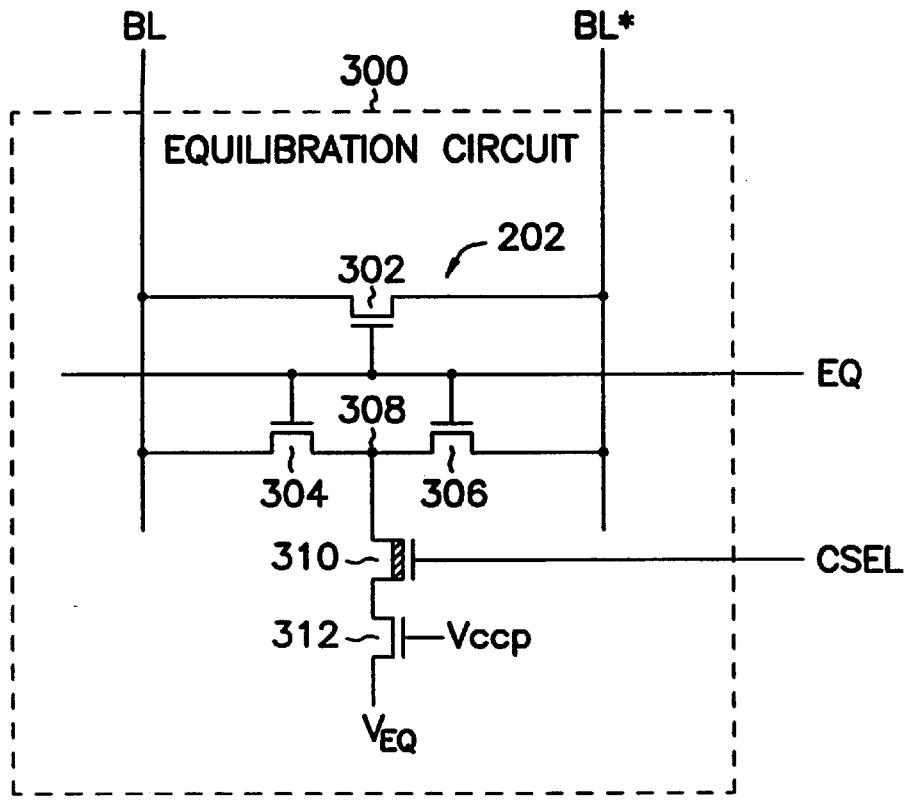
FIG. 3 is a schematic diagram of an embodiment of an equilibration circuit according to the teachings of the present invention.

FIG. 3 is a schematic diagram that illustrates an embodiment of an equilibration circuit according to the teachings of the present invention. Equilibration circuit 300 includes n-channel transistors 302, 304, and 306. A gate of each of transistors 302, 304, and 306 is coupled to control signal EQ. A first source/drain region of transistor 302 is coupled to bit line BL and a second source/drain region of transistor 302 is coupled to bit line complement BL*. A first source/drain region of transistor 304 is coupled to bit line BL and a second source/drain region of transistor 304 is coupled to node 308. A first source/drain region of transistor 306 is coupled to bit line complement BL* and a second source/drain region of transistor 306 is coupled to node 308. Equilibration circuit 300 further includes depletion mode transistor 310 and long L transistor 312 that are used to limit the current leakage by equilibration circuit 300. Transistor 310 includes a first source/drain region that is coupled to node 308. Additionally, transistor 310 includes a gate that is coupled to receive a control signal, CSEL. A second source/drain region of transistor 310 is coupled to a first source/drain region of transistor 312. A gate of transistor 312 is coupled to a pumped reference voltage that is above the power supply voltage. This voltage is labeled $V_{CCP}$. Finally, a second source/drain region of transistor 312 is coupled to equilibration voltage source $V_{EQ}$. The equilibration voltage is conventionally one-half of the power supply voltage, $V_{CC}/2$.

In operation, transistor 310 operates to disconnect equilibration voltage source $V_{EQ}$ from node 308 when either bit line BL or bit line complement BL* are defective. This is accomplished by providing a voltage to the gate of transistor 310 that is low enough to turn off transistor 310. A modified version of the column select signal CSEL may be used. Conventionally, the column select signal varies between ground potential for turning off the input/output transistors and a power supply potential which is used to turn on the input/output transistors. In this embodiment, a third state is added to the column select control signal. In this state, the voltage is reduced to below ground potential when a column is logically removed from a memory array. This prevents the equilibration voltage sources from leaking current through transistor 304 or 306 when either bit line BL or bit line complement BL* is maintained at ground potential due to a defect. Long L transistor 312 is used to limit current when bit line BL and bit line complement BL* are not defective.

Figure 4:
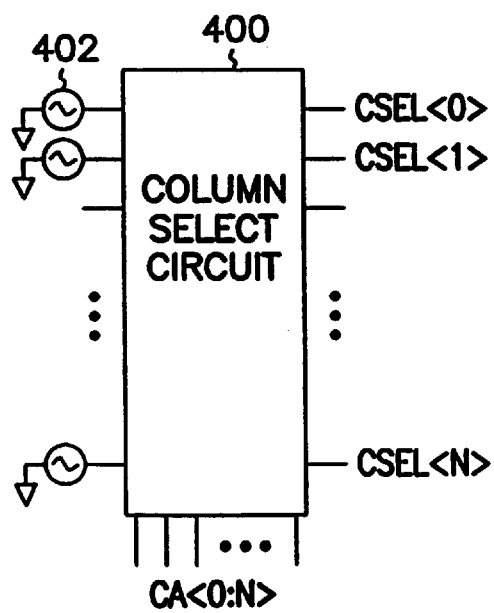
FIG. 4 is a block diagram of an embodiment of a column select circuit according to the teachings of the present invention.

FIG. 4 is block diagram of an embodiment of a column select circuit according to the teachings of the present invention. Column select circuit 400 is coupled to a number of laser fuses or anti-fuses 402 that indicate whether a specific column has been repaired out. Additionally, column select circuit 400 is also coupled to receive a column address CA<0:N> that indicates the column address of a selected cell. Column select circuit 400 provides output signals CSEL <0> . . . CSEL <N> that drive both input/output transistors and a depletion mode gate such as transistor 310 in FIG. 3 or transistor 212 in FIG. 2.

In operation, column select circuit 400 receives an address on address lines CA <0:N>. Column select circuit 400 determines whether the address corresponds to a repaired out column based on laser fuses or anti-fuses 402. Further, column select circuit 400 drives the appropriate output, CSEL <i>, to $V_{BB}$ if the laser fuse 402 indicates that the column has been repaired out. Alternatively, if the column is acceptable, column select circuit 400 will drive the appropriate output, CSEL <i>, to $V_{CC}$ so as to activate the input(output transistors and to allow the equilibration voltage source to be coupled to the equilibration circuit.

Figure 5:
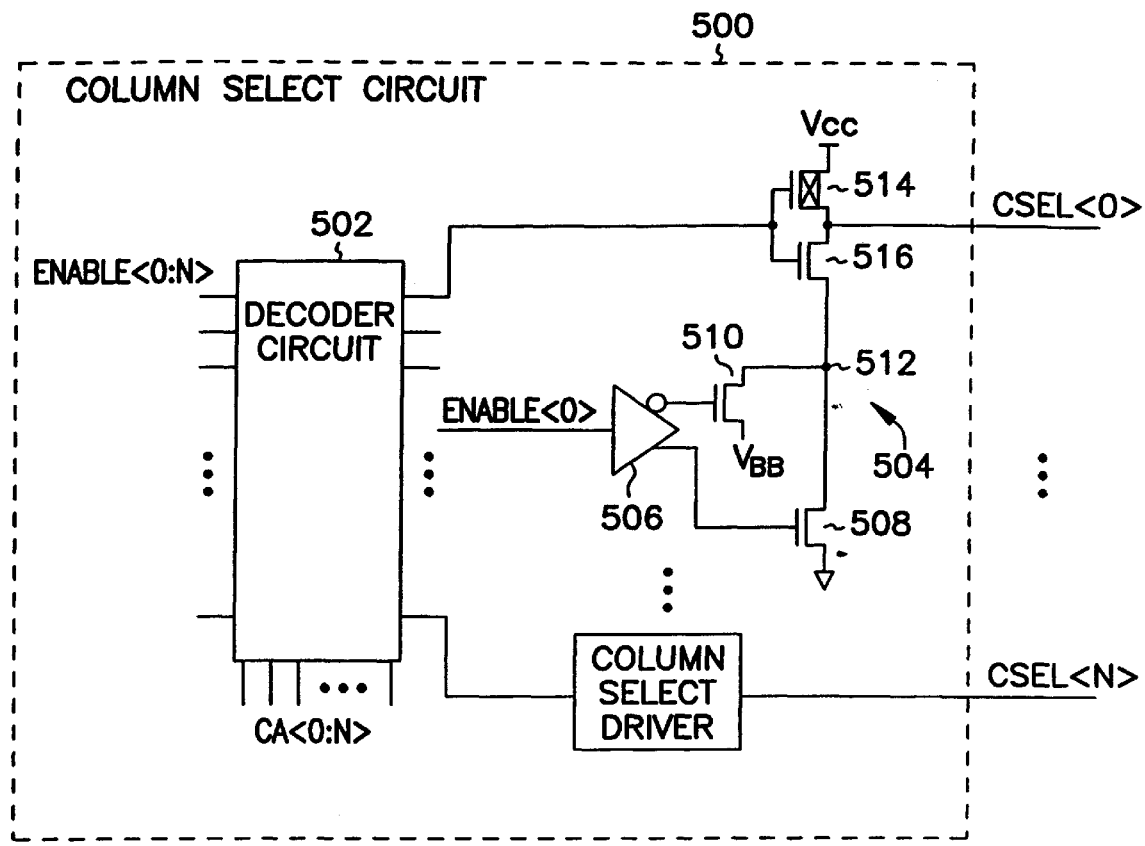
FIG. 5 is a schematic diagram of an embodiment of a column select circuit according to the teachings of the present invention.

FIG. 5 is an embodiment of a column select circuit according to the teachings of the present invention. Column select circuit 500 includes decoder circuit 502. Decoder circuit 502 is coupled to receive enable signals ENABLE <0:N> and column address signals CA <0:N>. Decoder circuit 502 provides outputs to a number of column select drivers that produce signals CSEL <0> . . . CSEL <N> used to access the column of a selected memory cell. The column select driver 504 for output CSEL <0> is shown by way of example.

Column select driver 504 includes $V_{BB}$ translator circuit 506 that translates a ground potential signal to $V_{BB}$. $V_{BB}$ translator circuit 506 includes a first output that is coupled to a gate of n-channel transistor 508. $V_{BB}$ translator circuit 506 also includes a complementary output that is coupled to a gate of n-channel transistor 510. A first source/drain region of transistor 508 is coupled to ground potential. Similarly, a first source/drain region of transistor 510 is coupled to $V_{BB}$. A second source/drain region of transistor 510 and a second source/drain region of transistor 508 are coupled to a common node 512. Decoder circuit 502 is coupled to a gate of p-channel transistor 514 and a gate of n-channel transistor 516. A first source/drain region of transistor 514 and a first source/drain region of transistor 516 are coupled together to provide the output of column select driver 504, labeled CSEL <0>. A second source/drain region of transistor 514 is coupled to $V_{CC}$. A second source/drain region of transistor 516 is coupled to node 512. Essentially, transistors 514 and 516 form an inverter and $V_{BB}$ translator circuit 506, and transistors 508 and 510 provide a variable low voltage for the inverter.

In operation, column select circuit 500 produces signals that disconnect an equilibration voltage source from an equilibration circuit that is associated with a defective bit line. Additionally, the output of column select circuit 500 controls the operation of input/output transistors for associated bit lines. Decoder circuit 502 receives a column address at inputs CA <0:N> that indicates a column of a memory array. Additionally, an enable signal for the column is also provided to the decoder circuit 502. Decoder circuit 502 determines whether the column address corresponds to a defective column. If the column is defective, column select driver 504 provides a negative voltage, e.g., $V_{BB}$, at output CSEL <0>. Assuming that the column associated with CSEL <0> is defective, the enable signal is at ground potential. The output of $V_{BB}$ translator circuit 506 turns off transistor 508 and applies a high voltage level, $V_{CC}$, to transistor 510, thus passing the voltage $V_{BB}$ to node 512. Additionally, decoder circuit 502 provides a high voltage to transistors 514 and 516. This turns off transistor 514 and transistor 516 passes the voltage $V_{BB}$ at node 512 to the output CSEL <0>. This turns off the gate coupling the equilibration voltage source to the equilibration circuit, thus preventing current from leaking from the equilibration voltage source to the defective bit line.

Figure 6:
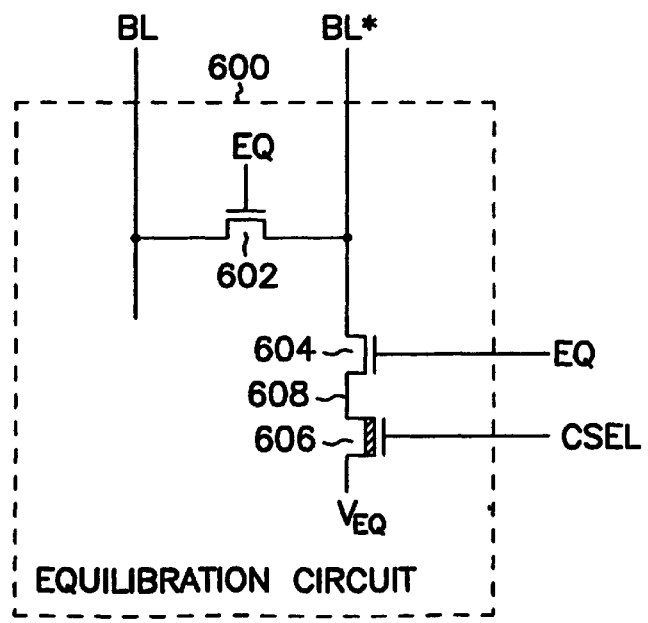
FIG. 6 is a schematic diagram of an alternative embodiment of an equilibration circuit according to the teachings of the present invention.

FIG. 6 is a schematic diagram of an alternative embodiment of an equilibration circuit according to the teachings of the present invention. Equilibration circuit 600 is coupled to a complementary pair of bit lines BL and BL*. Equilibration circuit 600 includes first and second equilibration n-channel transistors 602 and 604. Transistor 602 includes a first source/drain region coupled to bit line BL and a second source/drain region coupled to bit line complement BL*. Transistor 604 includes a first source/drain region coupled to bit line *. A gate of transistor 602 and a gate of transistor 604 are each coupled to a control signal EQ. Equilibration circuit 600 further includes depletion mode transistor 606. A first source/drain region of transistor 606 is coupled to a second source/drain region of transistor 604. Additionally, a second source/drain region of transistor 606 is coupled to a reference voltage $V_{EQ}$. The gate of transistor 606 is coupled to receive a control signal CSEL.

In operation, transistor 606 operates to disconnect equilibration reference voltage $V_{EQ}$ from node 608 when either bit line BL or bit line complement BL* are defective. This is accomplished by providing a voltage to the gate of transistor 606 that is low enough to turn off transistor 606. A modified version of the column select signal CSEL may be used. As described above, a conventional column select signal varies between ground potential for turning off the input/output transistors and a power supply potential which is used to turn on the input/output transistors. In this embodiment, a third state is added to the column select control signal. In this stage, the voltage is reduced to below ground potential when a column is logically removed from a memory array. This prevents the equilibration voltage source $V_{EQ}$ from leaking current through transistor 604 when either bit line BL or bit line complement BL* is maintained at ground potential due to a defect.

Figure 7:
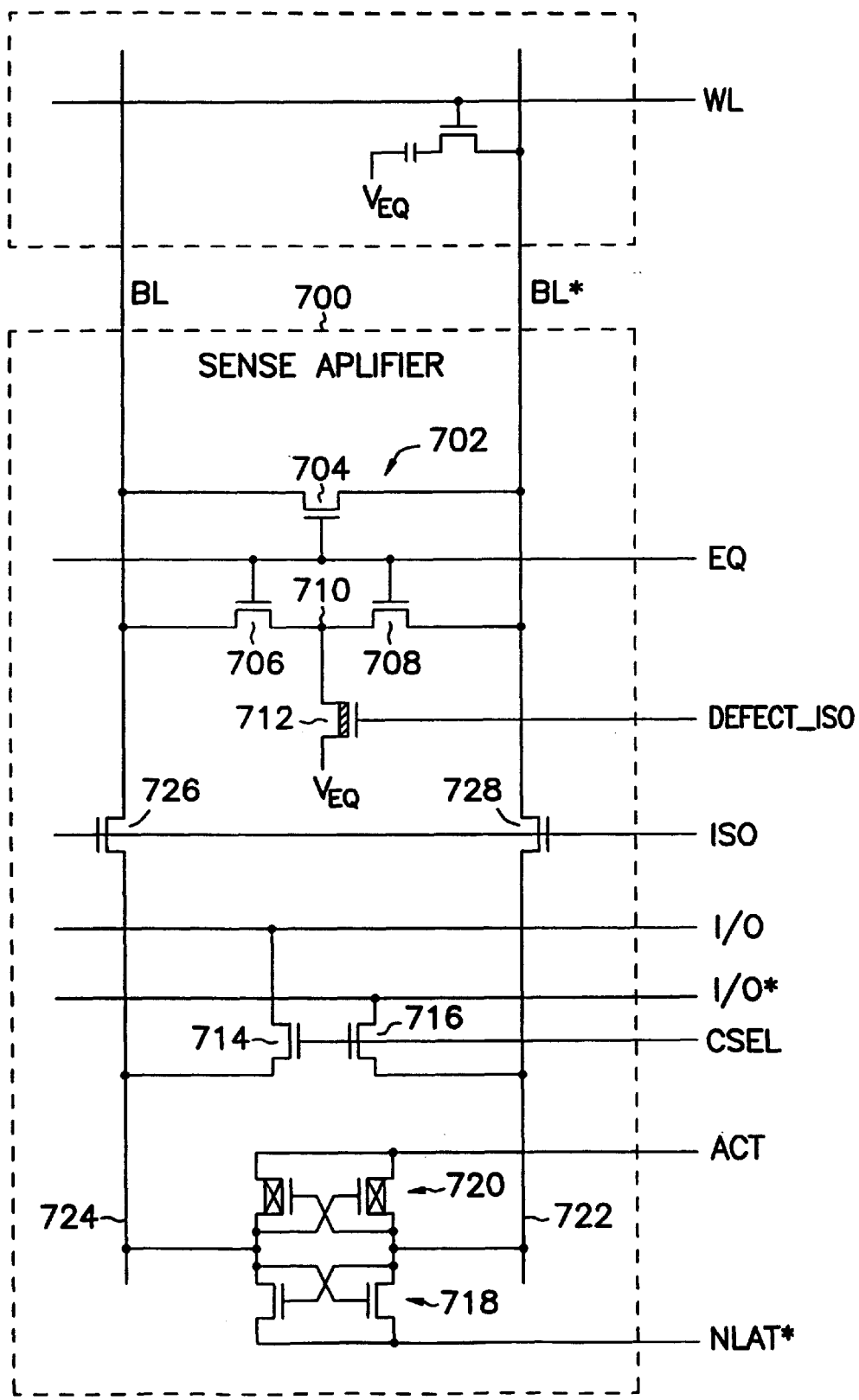
FIG. 7 is a schematic diagram of another embodiment of a sense amplifier according to the teachings of the present invention.

FIG. 7 is a schematic diagram of an embodiment of a sense amplifier according to the teachings of the present invention. Sense amplifier 700 includes equilibration circuit 702. Equilibration circuit 702 includes n-channel transistors 704, 706, and 708. Transistor 704, 706, and 708 each include a gate that is coupled to receive a control signal, EQ. Additionally, transistor 704 includes a first source/drain region coupled to bit line BL and a second source/drain region coupled to bit line complement BL*. Transistor 706 includes a first source/drain region coupled to bit line BL and a second source/drain region coupled to node 710. Similarly, transistor 708 includes a first source/drain region that is coupled to bit line complement BL* and a second source/drain region that is coupled to node 710.

In this embodiment, equilibration circuit 702 further includes a depletion mode transistor 712. Transistor 712 includes a first source/drain region that is coupled to node 710. A second source/drain region of transistor 712 is coupled to equilibration voltage source $V_{EQ}$. A gate of transistor 712 is coupled to receive control signal DEFECT_ISO. The DEFECT_ISO signal provides a negative voltage to the gate of transistor 712 when a defect is detected with respect to bit line BL or bit line BL* so as to decouple $V_{EQ}$ from equilibration circuit 702.

Input/output transistors 714 and 716 are coupled so as to pass data between bit line BL and input/output line I/O and between bit line complement BL* and input/output line complement I/O*, respectively. Control signal CSEL is provided to the gates of input/output transistors 714 and 716.

Sense amplifier 700 further includes n-sense amplifier 718 and p-sense amplifier 720 that are coupled between nodes 722 and 724. Sense amplifiers 718 and 720 comprise cross-coupled pairs of n-channel and p-channel transistors, respectively. N-sense amplifier 718 is controlled by a control signal labeled NLAT* and p-sense amplifier 720 is controlled by a control signal labeled ACT. Finally, sense amplifier 700 includes isolation transistors 726 and 728. Isolation transistor 726 couples bit line BL to node 724. Similarly, isolation transistor 728 couples bit line complement BL* to node 722. The gates of transistors 726 and 728 are coupled to a common control signal, ISO. It is understood that sense amplifier 700 may include an additional equilibration circuit and isolation transistors on the other side of n-sense amplifier 718 such that sense amplifiers 718 and 720 may be shared by two memory arrays.

Sense amplifier 700 provides the advantage of being able to disconnect equilibration voltage source $V_{EQ}$ from equilibration circuit 702 when bit line BL or bit line complement BL* has been repaired out of a memory array. In operation, equilibration voltage source $V_{EQ}$ is disconnected from equilibration circuit 702 by control signal DEFECT_ISO. When bit line BL or bit line complement BL* has been repaired out, control signal DEFECT_ISO will be reduced to a voltage that is preferably below ground potential. For example, the control signal DEFECT_ISO can be established at the voltage level for the back-bias voltage, $V_{BB}$. In normal operation, control signal DEFECT_ISO will be maintained at a voltage sufficient to keep transistor 712 on, e.g., $V_{CC}$.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the depletion mode transistors shown in the embodiments can be replaced by enhancement mode devices provided the control signal is modified so as to decouple the equilibration voltage supply when needed. Further, a resistive device can be added between the depletion mode device and the reference voltage of the embodiment shown in FIG. 7.

What is claimed is:

1. A column select circuit for a memory device, the column select circuit comprising:

a decoder circuit that determines whether a selected column address corresponds to a column that has been repaired out;

an inverter coupled to the decoder circuit with a variable low potential;

a pull down circuit coupled to the inverter so as to provide the variable low potential; and wherein the pull down circuit provides a negative voltage to the inverter when a selected column is disabled and provides ground potential to the inverter when the selected column is operable.

2. The column select circuit of claim 1, wherein the pull down circuit includes:

a first transistor with a first source/drain region coupled to ground potential and a second source/drain region coupled to the invertor;

a second transistor with a first source/drain region coupled to a negative voltage and a second source/drain region coupled to the inverter; and a control circuit coupled to a gate of the first and second transistors so as to selectively activate one of the first and second transistors.

3. The column select circuit of claim 1, wherein the pull down circuit includes a transistor that is coupled to ground and a transistor that is coupled to a back bias voltage ($V_{BB}$).

4. The column select circuit of claim 1, wherein a control circuit is coupled to an enable signal that indicates whether an associated column is defective.

5. The column select circuit of claim 1, wherein the decoder circuit is coupled to enable and column address lines.

6. A column select circuit, comprising:

a decoder circuit coupled to enable and column address lines; and a plurality of column select drivers, each column select driver generating an output signal with a negative voltage when an associated bit line is determined to be defective and generating an output signal that varies between ground and a positive voltage when an associated bit line is determined to be acceptable.

7. The column select circuit of claim 6, wherein the column select drivers each include an inverter with a low voltage for the inverter being established based on whether the bit line is defective.

8. A column select circuit for a memory device, the column select circuit comprising:

a decoder circuit, responsive to enable and column address lines, the decoder circuit determining whether a selected column address corresponds to a defective bit line;

a plurality of column select drivers responsive to the decoder circuit, each column select driver including:

an inverter coupled to the decoder circuit with a variable low potential, and a pull down circuit coupled to the inverter so as to provide the variable low potential; and wherein each pull down circuit includes:
- a first transistor with a first source/drain region coupled to ground potential and a second source/drain region coupled to the inverter,
- a second transistor with a first source/drain region coupled to a negative voltage and a second source/drain region coupled to the inverter, and
- a control circuit, responsive to an enable circuit, the control circuit coupled to a gate of the first and second transistors so as to selectively activate one of the first and second transistors.

9. The column select circuit of claim 8, wherein the second transistor is coupled to a back bias voltage ($V_{BB}$).

10. A column select circuit, comprising:
- means for determining whether a bit line is defective;
- means, responsive to the means for determining, for selectively applying a signal with a negative voltage to a transistor to isolate the equilibration source from the defective bit line when the bit line is defective; and
- means, responsive to the means for determining, for selectively applying a signal at ground potential to a transistor to not isolate the equilibration source from the bit line when the bit line is not defective.

11. The column select circuit of claim 10, wherein the means for selectively applying the signal with the negative voltage comprises means for selectively applying a back bias voltage ($V_{BB}$) to the transistor.

12. The column select circuit of claim 10, wherein the means for selectively applying the signal with the negative voltage comprises means for selectively applying the negative voltage to the gate of a depletion mode transistor.

13. A method for generating a column select signal, the method comprising:
- receiving an address signal on a plurality of column address lines;
- receiving enable signals on a plurality of enable lines;
- determining whether a bit line of an associated memory device is defective;
- when the bit line is defective,
    - generating the column select signal for the defective bit line with a negative voltage level, and
    - applying the column select signal to a gate of a depletion mode transistor that is coupled between the reference voltage source and the equilibration circuit for the defective bit line so as to isolate the reference voltage source from the equilibration circuit for the defective bit line; and
- when the column is not defective,
    - generating the column select signal with a voltage that varies between ground and a positive voltage so as to activate the depletion mode transistor and couple the reference voltage source to the equilibration circuit.

14. The method of claim 13, wherein determining whether a bit line of an associated memory device is defective comprises reading a fuse associated with the bit line.

* * * * *

UNITED STATES PATENT AND TRADEMARK OFFICE
CERTIFICATE OF CORRECTION

PATENT NO.: 6,118,728

DATED: Sep. 12, 2000

INVENTOR(S): Casper et al.

It is certified that error appears in the above-identified patent and that said Letters Patent is hereby corrected as shown below:

In column 1, line 21, delete "-" between "voltage" and "and" and insert a space therefor.

In column 2, line 27, insert --.-- after "circuit".

In column 2, line 29, insert --.-- after "short".

In column 3, line 31, insert --.-- after "circuit".

In column 4, line 26, delete "utilize" and insert --utilized--, therefor.

In column 7, line 43, delete "input(output" and insert --input/output--, therefor.

In column 10, line 26, delete "invertor" and insert --inverter--, therefor.

Signed and Sealed this

First Day of May, 2001

*Attest:*

NICHOLAS P. GODICI

*Attesting Officer*   Acting Director of the United States Patent and Trademark Office